United States Patent
Kim

(10) Patent No.: US 8,236,649 B2
(45) Date of Patent: Aug. 7, 2012

(54) SEMICONDUCTOR MEMORY DEVICE WITH SPACER SHAPE FLOATING GATE AND MANUFACTURING METHOD OF THE SEMICONDUCTOR MEMORY DEVICE

(75) Inventor: Dae Il Kim, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 84 days.

(21) Appl. No.: 12/634,000

(22) Filed: Dec. 9, 2009

(65) Prior Publication Data

US 2010/0163955 A1    Jul. 1, 2010

(30) Foreign Application Priority Data

Dec. 31, 2008 (KR) .................. 10-2008-0138848

(51) Int. Cl.
*H01L 21/336* (2006.01)
(52) U.S. Cl. ......... 438/267; 257/E21.209; 257/E29.129; 257/316; 438/211
(58) Field of Classification Search ............ 438/591, 438/267; 256/316, E21.422, E29.3
See application file for complete search history.

(56) References Cited

U.S. PATENT DOCUMENTS

| | | | | |
|---|---|---|---|---|
| 5,143,860 A * | 9/1992 | Mitchell et al. | | 438/262 |
| 6,083,792 A * | 7/2000 | Sung | | 438/264 |
| 6,525,371 B2 * | 2/2003 | Johnson et al. | | 257/317 |
| 6,642,110 B2 * | 11/2003 | Jung et al. | | 438/264 |
| 2002/0052080 A1 * | 5/2002 | Lee | | 438/257 |
| 2002/0142543 A1 * | 10/2002 | Lin et al. | | 438/257 |
| 2005/0124133 A1 * | 6/2005 | Tu | | 438/397 |
| 2005/0269622 A1 * | 12/2005 | Klinger et al. | | 257/315 |
| 2007/0077706 A1 * | 4/2007 | Orlowski et al. | | 438/257 |

* cited by examiner

*Primary Examiner* — Matthew Landau
*Assistant Examiner* — Khaja Ahmad
(74) *Attorney, Agent, or Firm* — Saliwanchik, Lloyd & Eisenschenk

(57) ABSTRACT

A semiconductor memory device is provided including: a spacer shaped floating gate formed on a semiconductor substrate; a dielectric layer spacer formed at one side wall of the floating gate; a third oxide layer formed over the floating gate and the dielectric layer; and a control gate formed over the third oxide layer. According to an embodiment, the structure of the floating gate in a plate shape whose center is concave is improved to the spacer structure, making it possible to minimize the size of the semiconductor memory device and to improve density. Moreover, a LOCOS process can be excluded while forming the floating gate, making it possible to more efficiently fabricate the device.

13 Claims, 4 Drawing Sheets

SEMICONDUCTOR MEMORY DEVICE WITH SPACER SHAPE FLOATING GATE AND MANUFACTURING METHOD OF THE SEMICONDUCTOR MEMORY DEVICE

CROSS-REFERENCE TO RELATED APPLICATION

This application claims the benefit under 35 U.S.C. §119 of Korean Patent Application No. 10-2008-0138848, filed Dec. 31, 2008, which is hereby incorporated by reference in its entirety.

BACKGROUND

The present disclosure relates to a semiconductor memory device and a manufacturing method of the semiconductor memory device.

In the case of a semiconductor memory device, such as in a silicon storage technology (SST) flash non-volatile memory (NVM) cell, a problem arises in that cell size becomes large while forming a gate electrode.

FIG. 1 is a cross-sectional view showing a gate structure of a semiconductor memory device.

Referring to FIG. 1, a gate dielectric layer 11 is formed on a semiconductor substrate 10 on which source and drain areas (not shown) are formed, and a floating gate 12 is formed over a portion of the area over the gate dielectric layer 11.

A control gate 13 is formed on the other area of the gate dielectric layer 11 and over a portion of the floating gate 12.

A dielectric layer 14 is formed over the floating gate 12 and the control gate 13, including the area between the floating gate 12 and the control gate 13, thereby completing the gate structure as shown in FIG. 1.

FIG. 1 is a cross-sectional view so that it is difficult to sort the shape of the floating gate 12. Though not clearly shown in the drawing, the floating gate 12 of the related art is formed in a plate shape that is a dish shape whose center is concave.

In order to make the plate shape whose center is concave as described above, the floating gate 12 is formed through a local oxidation of silicon (LOCOS) process, including an oxidation process and an annealing process on one surface thereof.

Therefore, as shown in FIG. 1, the floating gate 12 is formed to be larger than needed for its function by a length L in the side direction. Such a structure restricts device density as the size of the semiconductor memory device becomes more miniaturized.

BRIEF SUMMARY

Embodiments of the present invention provide a semiconductor memory device and method of manufacturing the same that can minimize the size of a memory cell by improving the structure of a floating gate. According to an embodiment, a LOCOS process is excluded in the manufacturing of a semiconductor memory device when forming a floating gate.

A semiconductor memory device according to an embodiment includes: a floating gate formed having a spacer shape on a semiconductor substrate; a dielectric layer formed at one side wall of the spacer shaped floating gate, the dielectric layer having a spacer shape; a third oxide layer formed over the floating gate and the dielectric layer; and a control gate formed over the third oxide layer.

A manufacturing method of a semiconductor memory device according to an embodiment includes: forming a nitride pattern on a semiconductor substrate; forming a floating gate in a spacer shape at the side walls of the nitride pattern; forming a first oxide layer at the side walls of the floating gate; removing the nitride pattern; forming a dielectric layer in a spacer shape at the side wall of the floating gate exposed by the removal of the nitride pattern; forming a third oxide layer over the first oxide layer, the dielectric layer, and the semiconductor substrate; forming a polysilicon layer over the third oxide layer; and etching the polysilicon layer, the third oxide layer and the first oxide layer to form a control gate over the floating gate.

DETAILED DESCRIPTION

An embodiment of a semiconductor memory device and a manufacturing method of a semiconductor memory device will be described in detail with reference to the accompanying drawings.

It is considered that the semiconductor memory device according to one embodiment is a silicon storage technology (SST) flash non-volatile memory (NVM).

Hereinafter, in describing embodiments, the detailed description of the relevant well-known functions or elements may make the gist of the present disclosure obscure. Therefore, only core elements related directly to the technical idea of the present invention will be described.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

The technical idea of the present embodiment is closely related to the gate structure of the semiconductor memory device, such that hereinafter, the detailed description of the structure and operation of other layers or elements of the semiconductor memory device will be omitted.

Figure 1:
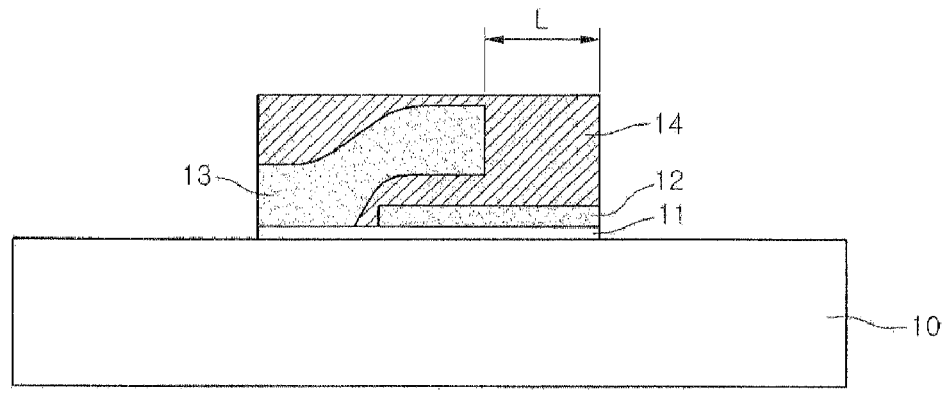
FIG. 1 is a cross-sectional view showing a gate structure of a semiconductor memory device.
Figure 2:
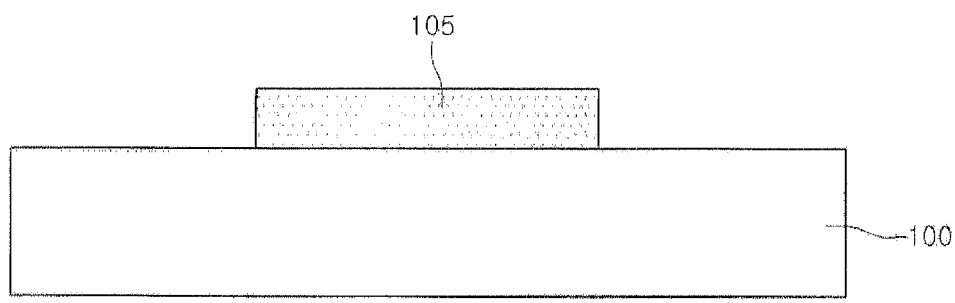
FIGS. 2-12 are cross-sectional views illustrating a method of manufacturing a semiconductor memory device in accordance with an embodiment of the present invention.

Referring to FIG. 2, a nitride layer is formed on a semiconductor substrate 100 on which source and drain areas (not shown) are formed. The semiconductor substrate 100 can be, for example, a semiconductor substrate in a single crystal silicon wafer state. A nitride pattern 105 can be formed by performing a photolithography process and a dry etching process with respect to the nitride layer.

Therefore, the nitride pattern 105 as shown in FIG. 2 is formed.

Figure 3:
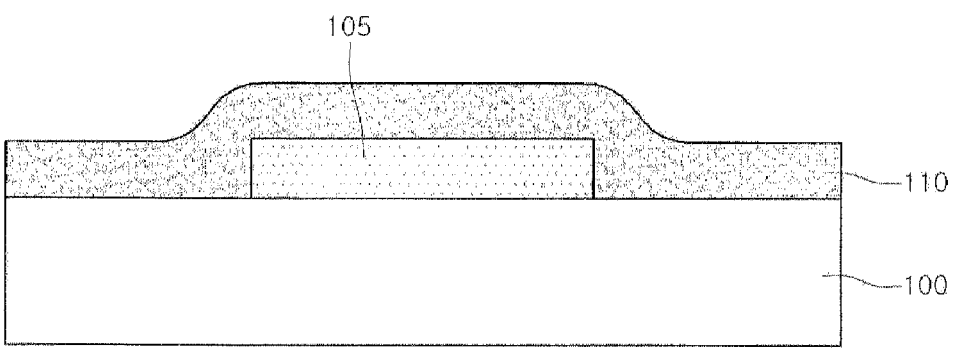

Referring to FIG. 3, a polysilicon layer 110 is formed on the semiconductor substrate 100 including the nitride pattern 105. At this time, the polysilicon layer 110 may be deposited using a chemical vapor deposition (CVD) method.

Figure 4:
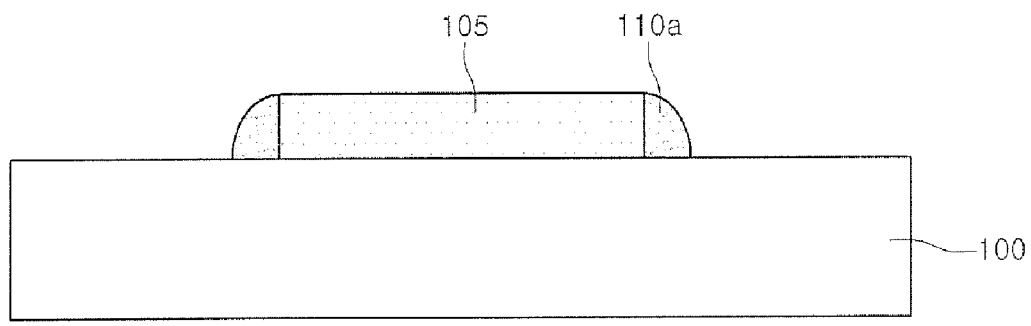

Referring to FIG. 4, an etching process is performed on the polysilicon layer 110 using a blanket etch method, thereby maintaining the polysilicon layer 110 in a spacer shape on both sides of the nitride pattern 105.

The polysilicon layer 110 in the spacer shape may function as the floating gate 110a.

Figure 5:
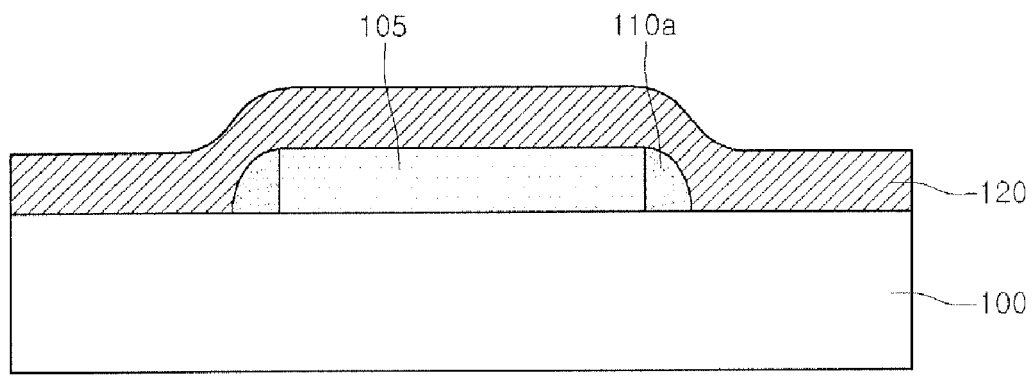

Continuously, as shown in FIG. 5, a first oxide layer 120 is formed over the semiconductor substrate 100, including over the nitride pattern 105 and the floating gate 110a.

The first oxide layer 120 may be deposited using a CVD method.

Figure 6:
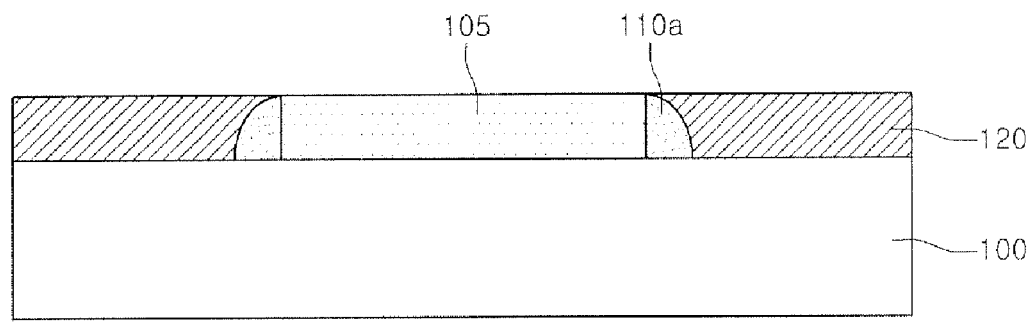

Continuously, referring to FIG. 6, the first oxide layer 120 is planarized using a polishing process such as a chemical mechanical polishing (CMP) process so that the surface of the nitride pattern 105 is exposed.

Therefore, the first oxide layer 120 is maintained only at the side surfaces of the floating gate 110a and not on the nitride pattern 105.

Figure 7:
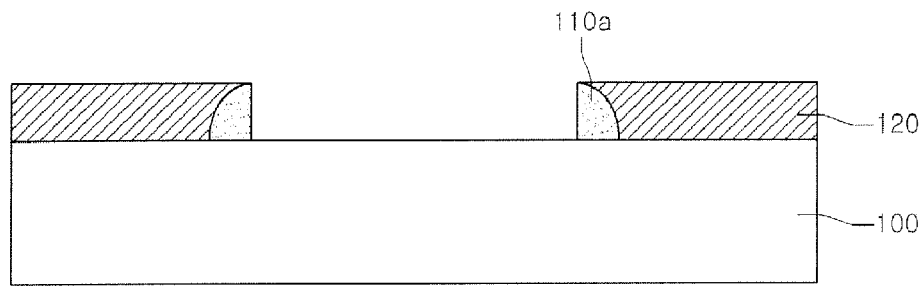
Figure 8:
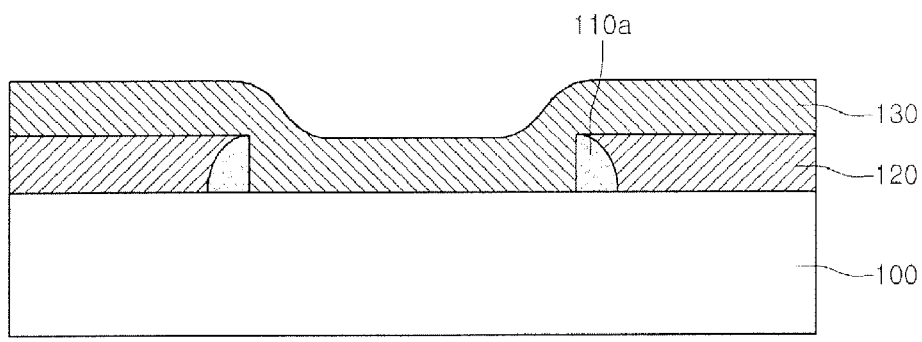
Figure 9:
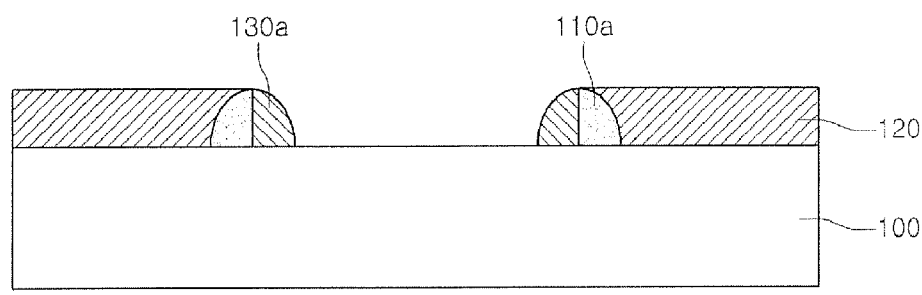

FIG. 7 is a cross-sectional view showing the semiconductor memory device shape after the nitride pattern 105 is removed, FIG. 8 is a cross-sectional view showing the semiconductor memory device shape after a second oxide layer 130 is formed, and FIG. 9 is a cross-sectional view showing the semiconductor memory device shape after a dielectric layer spacer 130a is formed.

Accordingly, referring to FIG. 7, in one embodiment, the nitride pattern 105 can be removed by forming a photoresist pattern (not shown) that opens the nitride pattern 105, and performing a dry etching process using the photoresist pattern as an etching mask.

Next, as shown in FIG. 8, a second oxide layer 130 is formed over the first oxide layer 120 and the exposed semiconductor substrate 100 where the nitride pattern 105 is removed. An etching process can then be performed on the second oxide layer 130 using a blanket etch method.

Therefore, as shown in FIG. 9, a second oxide layer spacer 130a is maintained at the side surface of the floating gate 110a in the region where the nitride pattern 105 was removed.

The second oxide layer spacer 130a may also function as a dielectric layer spacer that isolates the floating gate 110a from a control gate (105a in FIG. 12) to be formed later.

Figure 10:
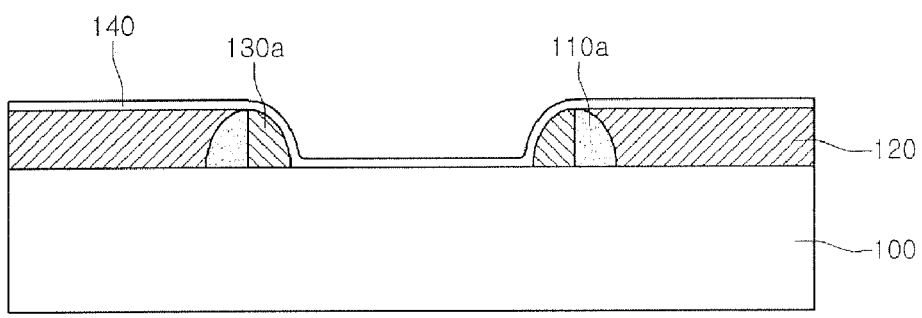

Continuously, as shown in FIG. 10, a third oxide layer 140 that functions as a gate oxide layer is formed over the first oxide layer 120, the dielectric layer spacer 130a, and the semiconductor substrate 100.

Figure 11:
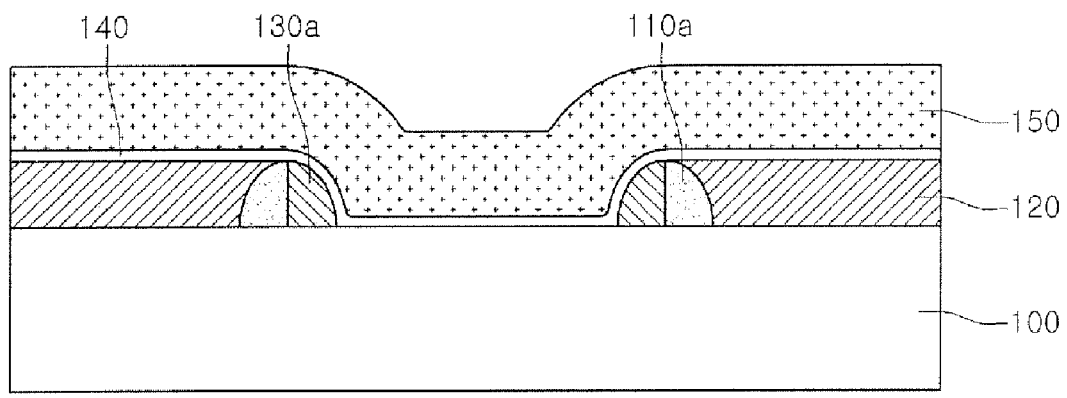

After the third oxide layer 140 is formed, a polysilicon layer 150 is formed over the third oxide layer 140, as shown in FIG. 11.

Figure 12:
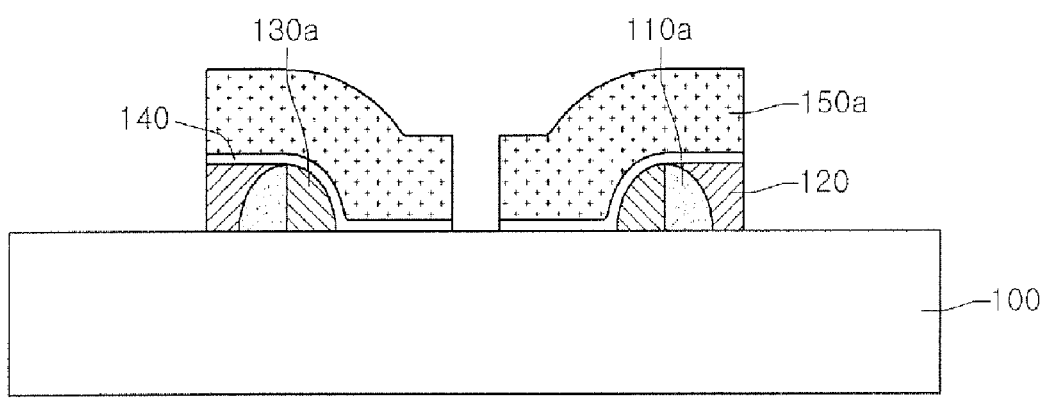

FIG. 12 is a cross-sectional view showing a semiconductor memory device shape after a control gate 150a according to an embodiment is formed.

In one embodiment, a photoresist pattern (not shown) is formed that exposes a portion of the polysilicon layer 150 at the side of the floating gate 110a and a portion of the polysilicon layer 150 between the dielectric layer spacers 130a, and an etching process is performed thereon.

Therefore, as shown in FIG. 12, the third oxide layer 140 is maintained over the floating gate 110a, the dielectric layer spacer 130a, and a portion of the first oxide layer 120 at one side of the floating gate 110a.

Moreover, the polysilicon layer 150 having the same pattern as the third oxide layer 140 constitutes the control gate 150a.

Though not shown, an insulation layer can be formed on the semiconductor substrate 100 including the control gate 150a, and a contact plug process, a metal wiring process, etc. may further be performed.

In accordance with embodiments, the following acting effects can be obtained:

First, the structure of the floating gate in a plate shape whose center is concave is improved to the spacer structure, making it possible to minimize the size of the semiconductor memory device and to improve density Second, the LOCOS process can be excluded while forming the floating gate, making it possible to more efficiently perform the device fabrication process and to improve the production yield.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A manufacturing method of a semiconductor memory device, comprising:
    forming a nitride pattern on a semiconductor substrate;
    forming a floating gate in a spacer shape at a side wall of the nitride pattern;
    forming a first oxide layer at a side wall of the floating gate;
    removing the nitride pattern;
    forming a dielectric layer spacer at an exposed side wall of the floating gate, the exposed side wall of the floating gate being exposed by the removing of the nitride pattern;
    forming a third oxide layer over the first oxide layer, the dielectric layer, and the semiconductor substrate;
    forming a polysilicon layer over the third oxide layer; and
    etching portions of the polysilicon layer, the third oxide layer, and the first oxide layer to form a control gate over the floating gate, the dielectric layer spacer, and a part of the first oxide layer.

2. The manufacturing method of the semiconductor memory device according to claim 1, wherein the forming of the floating gate comprises:
    forming a first polysilicon, layer on the semiconductor substrate including the nitride pattern; and
    etching the polysilicon layer using a blanket etch method.

3. The manufacturing method of the semiconductor memory device according to claim 1, wherein the forming of the first oxide layer at the side wall of the floating gate comprises:
    forming the first oxide layer on the semiconductor substrate including on the nitride pattern and the floating gate; and
    planarizing the first oxide layer until the nitride pattern is exposed.

4. The manufacturing method of the semiconductor memory device according to claim 3, wherein at least one of the polysilicon layer and the first oxide layer are formed using a CVD method.

5. The manufacturing method of the semiconductor memory device according to claim 1, wherein the forming of the dielectric layer spacer comprises:
  forming a second oxide layer over the first oxide layer, the floating gate, and the semiconductor substrate; and
  etching the second oxide layer using a blanket etch method.

6. The manufacturing method of the semiconductor memory device according to claim 1, wherein the semiconductor memory device is a silicon storage technology (SST) flash non-volatile memory (NVM).

7. A semiconductor memory device comprising:
  a floating gate formed on a semiconductor substrate, the floating gate having a sidewall spacer shape;
  a dielectric layer spacer formed at one side wall of the floating gate;
  a third oxide layer formed over the floating gate and the dielectric layer; and
  a control gate formed over the third oxide layer;
  wherein shapes of the floating gate and the dielectric layer spacer are symmetric.

8. The semiconductor memory device according to claim 7, further comprising:
  a first oxide layer formed at a second side wall of the floating gate, the second side wall being opposite the one side wall having the dielectric layer spacer,
  wherein the third oxide layer extends over an upper surface of the first oxide layer.

9. The semiconductor memory device according to claim 7, wherein the third oxide layer extends onto a portion of the semiconductor substrate at a side of the dielectric layer spacer.

10. The semiconductor memory device according to claim 7, wherein the floating gate and the control gate each comprise polysilicon material.

11. The semiconductor memory device according to claim 7, wherein the dielectric layer comprises an oxide.

12. The semiconductor memory device according to claim 7, wherein the semiconductor memory device is a silicon storage technology (SST) flash non-volatile memory (NVM).

13. The semiconductor memory device according to claim 8, wherein the first oxide layer and the dielectric layer spacer have different shapes, respectively.

\* \* \* \* \*